United States Patent [19]

Pelletier et al.

[11] Patent Number: 5,102,687

[45] Date of Patent: Apr. 7, 1992

[54] PROCESS FOR SURFACE TREATMENT BY PLASMA OF A SUBSTRATE SUPPORTED BY AN ELECTRODE

[75] Inventors: Jacques H. Pelletier, Le Mûrier; Yves A. M. Arnal, Poisat; Laurent J. E. Vallier, Meylan; Michel G. A. Pichot, Grenoble, all of France

[73] Assignees: Centre National de la Recherche Scientifique-C.N.R.S., Paris; Etat Francais, Represente Par le Ministre Delegue Des Pos Tes, Destelecommunications et de L'Space-Centre Nation Al D'Etudes Des Telecommunications (C.N.E.T.), Les Moulineaux, both of France

[21] Appl. No.: 440,326

[22] Filed: Nov. 22, 1989

[30] Foreign Application Priority Data

Nov. 23, 1988 [FR] France ............................ 88 15630

[51] Int. Cl.$^5$ ...................... B05D 3/06; H01L 21/306; B44C 1/22
[52] U.S. Cl. ......................................... 427/38; 427/39; 156/643; 156/627
[58] Field of Search .................... 427/38, 39; 156/627, 156/643; 118/723, 50.1

[56] References Cited

U.S. PATENT DOCUMENTS

| 4,615,299 | 10/1986 | Matsuyama et al. | 118/723 |
| 4,795,529 | 1/1989 | Kawasaki et al. | 156/643 |
| 4,915,977 | 4/1990 | Okamoto et al. | 427/37 |

FOREIGN PATENT DOCUMENTS 01-15927 1/1989 Japan .

Primary Examiner—Michael Lusignan
Assistant Examiner—Roy V. King
Attorney, Agent, or Firm—Bacon & Thomas

[57] ABSTRACT

This invention relates to a process for surface treatment of a substrate carried by an electrode and immersed in a sealed engraving or deposition chamber equipped with plasma generating means, of the type involving the application to the electrodes, of a variable voltage, produced by a generator that is independent of the plasma generating means, wherein said process comprises the steps of:

maintaining within said chamber a continuous plasma that is free of electromagnetic fields;

supplying said electrode via a low impedance capacitor using a signal comprised of rectangular voltage pulses having:

a variable pulse repetition rate to control the energy distribution function of the positive ionic charges bombarding the substrate, a variable mark-to-space ratio for each pulse to control the time distribution of the negative electron charges and the positive ionic charges bombarding the substrate, and a variable pulse amplitude to control the energy of the positive ionic charges bombarding the substrate.

3 Claims, 2 Drawing Sheets

Fig. 3

| SILICON | A | 1/T | $\tau/(T-\tau)$ |
|---|---|---|---|
| ETCHING RATE | ⇢→ | ⇢→ | ↓ |

Fig. 4

| SILICON DIOXIDE | A | 1/T | $\tau/(T-\tau)$ |
|---|---|---|---|
| ETCHING RATE | ↑ | ⇢ | ↗ |

PROCESS FOR SURFACE TREATMENT BY PLASMA OF A SUBSTRATE SUPPORTED BY AN ELECTRODE

BACKGROUND OF THE INVENTION

1. Field of the Invention

The present invention relates to processes for surface treatment, of an insulating substrate, e.g.; by layer growth, deposition or etching methods, and more particularly of an insulating substrate subjected to a flux due to ion and electron bombardment from a plasma.

More specifically, the present invention relates to treatment processes in which the substrate is supported by an electrode, while the plasma is created independently of the electrode supporting the substrate.

2. Prior Art

In order to obtain a surface treatment with well-determined characteristics, it is important to control, among other things, the ion and electron flux bombarding the substrate.

A number of prior art processes exist for controlling the bombarding flux, and are adapted to regulate the biasing of the electrode placed in a plasma.

One such process, disclosed in Journal of Physics D: Appl. Phys. 19 (1986), pp 795-809 consists in applying, through a low impedance capacitor, a symmetrical sinusoidal or square-wave signal to a substrate placed on an electrode immersed in a continuous plasma.

In the above process, the low impedance capacitor connected in series with the voltage generator and the electrode ensures that the charges (positive ions and then electrons) are accumulated over one period, and hence provides self-regulation of the electrode biasing with respect to the plasma potential.

A first drawback with this process concerns the application of a sinusoidal signal when the frequency f of the applied signal is less than, or on the order of, the ionic plasma frequency $f_{p+}$, that is:

$$\omega < \omega_{p+} (\omega = 2\pi f),$$

with $$\omega_{p+}^2 = \frac{n_+ e^2}{\epsilon_o m_+}$$

where:

$\omega_{p+}$ is the ionic plasma pulse,
$n_+$ is the positive ion density in the plasma,
$m_+$ is the positive ion mass,
$\epsilon_o$ is the permittivity in vacuuo.
e is the absolute electron charge.

In the above case, the energy dispersion of the ions bombarding the electrode is equal to the product of the electron charge e and the peak applied signal voltage. Although non-damaging for some surface treatments, this dispersion cannot be considered so for all surface treatments.

Apart from the energy distribution of the ions accelerated towards the electrode in the case of a low-frequency self-biaising ($\omega < \omega_{p+}$), the prior art process cannot ensure a good control of the time distribution of the charged particles that bombard the electrode, namely the positive ions and electrons.

Japanese patent JP-6277 479 of Sept. 30, 1985 teaches the implementation of a plasma process in which an asymmetrical voltage waveform is applied, through a capacitor, across the two exciter electrodes for a capacitative discharge, in view of reducing the bombarding energy of the ions on the electrode supporting the substrate to be treated. This process clearly has a first drawback in that it is impossible to control the relative periods of ionic and electron bombarding without simultaneously modifying the bombarding energy of the positive ions on the two electrodes. This drawback arises from the fact that plasma excitation cannot be disassociated from the interaction of the same plasma with the electrodes. In other words, in that type of plasma, not only will the overall balance of the discharges in fact depend on all the variables that are external to be discharged, but also the interaction in fact, depend on all the variables that are external to be discharged, but also the interaction of the plasma with the electrodes.

The process also has a second drawback insofar as the sustaining of the discharge between the electrodes requires the presence of a sufficiently high voltage between the electrodes. Accordingly, there is generally required a bombarding energy on the order of, or in excess of, 150 eV to sustain the discharge, which prohibits the adjustment of the relative bombarding periods in the ionic bombarding energy ranges that are below the value corresponding to the breakdown and discharge sustaining voltage. In many instances e.g. of engraving, this process makes it difficult, if not impossible, to obtain a good degree of selectivity, which can only be achieved at a low energy, in other words in the absence of sputtering.

Finally, a lowering of the applied voltage, i.e. of the power injected into the plasma, introduces a corresponding drop in the plasma density and hence in the speed of etching.

Further, the surface chemical reactions that occur in the plasma are of an electrochemical nature, so that the time distribution of the charged particles bombarding the substrate constitutes a parameter that needs to be taken into consideration in the control of the etching process and, more generally, in surface treatments.

SUMMARY OF THE INVENTION

The present invention is intended to overcome the drawbacks of the prior art processes by proposing a surface treatment process for a substrate supported by an electrode and immersed in a plasma, the said process allowing to control the following, as desired and independently, in relation to the surface treatment to be executed: the energy distribution function of the positive ionic charges bombarding the substrate, the time distribution of the negative electron charges and the positive charges bombarding the substrate.

According to the present invention, there is provided a surface treatment process that in particular allows an optimization of both the etching speed, irrespective of the type of substrate to be treated and the selectivity for etching two superimposed layers.

These aims are attained according to the present invention by a process for the surface treatment of a substrate wherein said substrate comprises the steps of:

maintaining within the chamber a continuous plasma that is free of electromagnetic fields;

supplying said electrode via low impedance capacitor using signal comprised of rectangular voltage pulses having:

a variable pulse repetition rate to control the energy distribution function of the positive ionic charges bombarding the substrate, a variable mark-to-space ratio for each pulse to control the time distribution of the negative electron charges and the positive ion charges bombarding the substrate, and a variable pulse amplitude to control the energy of the positive ionic charges bombarding the substrate.

The present invention also relates to an apparatus for implementaing the said inventive process.

BRIEF DESCRIPTION OF THE DRAWINGS

The present invention shall be more clearly understood, and its advantages wil likewise become more apparent upon reading the following description with reference to the appended drawings, in which:

FIGS. 3 and 4 are tables showing the effect of the process according to the present invention on an etching operation.

Referring to FIG. 1, there is shown a machine generally used for the surface treatment of a substrate and equipped with a device for implementing the process according to the present invention. The machine, which can for instance carry out etching or deposition operations, is comprised of a vacuum chamber 1 connected to ground and fitted with means 2 that are advantageously designed to produce a continuous plasma free of electromagnetic fields. These means 2 can be of any type known in the art for producing such a plasma, and can e.g. be of the multipolar filament type.

Figure 1:
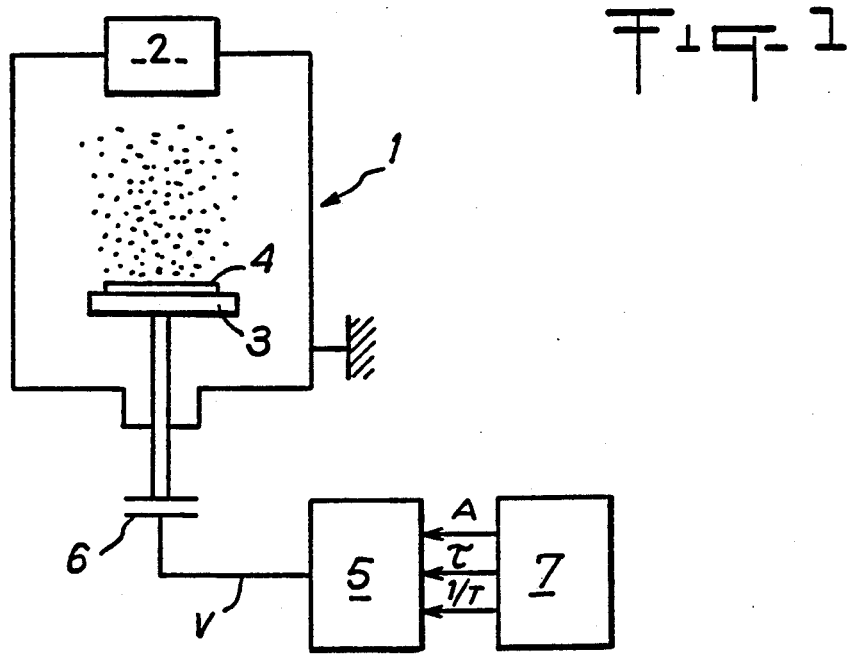
FIG. 1 is a schematic diagram of a treatment machine equipped on apparatus made to implement the process according to the present invention.

Inside the vacuum chamber 1 is contained a sample holder in the form in the form of an electrode 3 provided to support a substrate 4 that is inserted through a hatch (not shown in the drawings). The substrate 4 is subjected to a plasma for the purpose of the surface treatment operations to be performed. The electrode 3 is biased with respect to the plasma potential by means of the apparatus according to the present invention, which is totally independent of the plasma producing means 2.

The biasing device according to the present invention comprises a generator 5 connected to the electrode 3 thrugh a low impedance capacitor 6, plus a generator control circuit 7 whose function shall become clearer from the following description.

Figure 2:
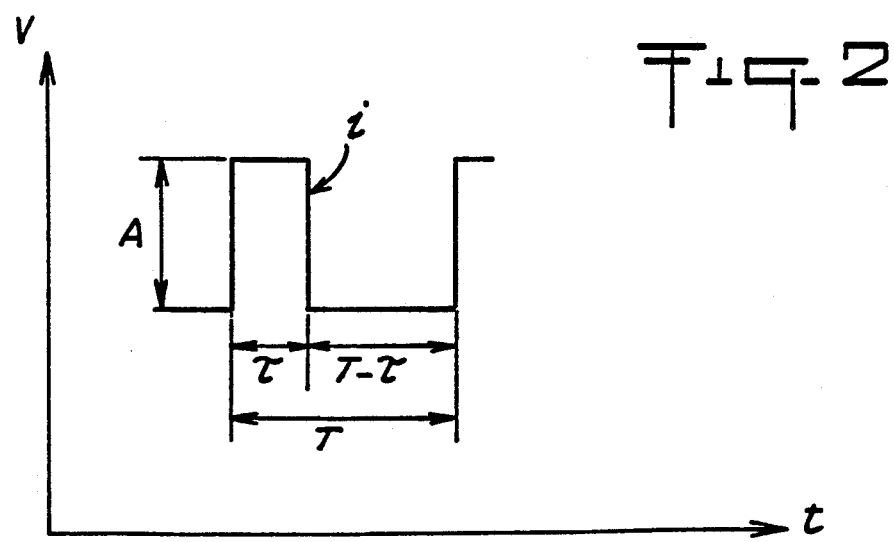
FIG. 2 is a diagram of the signal applied to the electrode supporting the substrate according to the present invention.

As can be more clearly understood from FIG. 2, the generator 5 can deliver a signal V comprised of rectangular voltage pulses i having a repetition rate $1/T$, a pulse width $\tau$ and an amplitude A. According to the invention, the signal V has a repetition rate $1/T$, a mark to space ratio $\tau/(T-\tau)$ and an amplitude A that are variable thereby allowing control of the ionic and electron flux bombarding the substrate 4.

In this way, the adjustment of the pulse repetition rate $1/T$ provides control of energy distribution function of the positive charges bombarding the substrate, while the adjustment of the mark to space ratio of each pulse provides control of the time distribution of the negative electron charges and the positive ionic charges bombarding the substrate. In addition, the adjustment of the pulse amplitude A allows control of the energy $W_+$ of the positive ionic charges bombarding the substrate.

If the pulses i applied to the electrode are not strictly rectangular, but have moderate rise and fall times in comparison with the pulse width, the effectiveness of the treatment remains practically unaltered. Accordingly, it should be borne in mind that the term rectangular signal can apply to any signal whose actual shape remains close to that of a rectangular signal.

The control circuit 7 serves to select the amplitude values A, repetition rates $1/T$ and the mark to space ratio $\tau(T-\tau)$ of the signal pulses in accordance with the parameters for implementing the operations required for the treatment.

Advantageously, the pulse repetition rate is adjustable on either side of the ionic plasma frequency and is preferably maintained constant in time for a given treatment operation.

If the pulse repetition rate is greater than the ionic plasma frequency $f_{p+}$, then the energy $W_+ = e(V_p - V_o)$ is constant in time. If the electronic temperature is low, such that $eA \gg kT_e$, and if the mark to space ratio does not take on extreme valves, say $1/20 < \tau/(T-\tau) < 20$, then the calculation yields:

$$V_p - V_o \approx -V_f + A((T-\tau)/T) + (kT_e/e)\text{Ln } \tau/T$$

where:

$V_p$ is the plasma potential;
$V_o$ is the self-biasing voltage;
$V_f$ is the floating potential of the plasma;
A is the pulse amplitude;
k is Boltmann's constant;
$T_e$ is the plasma electronic temperature;
$\tau$ is the positive pulse duration; and
$1/T$ is the pulse repetition rate.

Assuming that $\ln \tau/T$ does not exceed a few units, the order of magnitude of the ion energy will be:

$$W_+ \approx e(V_p - V_o) = eA((T-\tau)/T)$$

The mark to space ratio of each pulse will therefore be advantageously between 1/20 to 20 and kept constant in time for a given treatment operation.

To illustrate the inventive treatment process by way of an example, FIG. 3 shows the qualitative influence of an increase in the amplitude, repetition rate and mark to space ratio of the electric signal V on the etching parameters.

In the case of etching on silicon substrate by halogen gas, there appears an oxidation reaction that is enhanced by positive ionic charge bombardment, but greatly inhibited negative electronic charge bombardment. This calls for a regulation of the mark to space ratio of the signal to control the time distribution of the particles bombarding the substrate and thereby obtain an optimized etching rate of a given substrate at a given energy.

Thus, the etching rate on silicon in a fluorinated gas increases slowly as the amplitude A is raised, decreases slowly as the repetition rate increases, and drops sharply as the mark to space ratio increased.

In the case of etching a silicon substrate by fluorine, it appears that silicon etching can be enhanced both by the ionic charges and the electronic charges bombarding the substrate, for an energy threshold that is different for the ionic and electronic charges. Accordingly, the control of silicon etching calls for a regulation of both the signal repetition rate, to obtain the desired energy distribution function of the ionic charges, and the mark to space ratio to obtain the time distribution of the electronic charges and positive ionic charges impinging on the substrate.

As can be seen from FIG. 4, the speed etching of silicon increases with the amplitude as well as with the mark to space ratio, and remains substantially constant with respect to increases in the repetition rate.

Thus, if the selectivity of etching silicon, as opposed to silicon dioxide, is to be favored, it would be required to increase the duration of positive ionic charge bombardment and accordingly reduce the duration of electronic charge bombardment. To that end, the repetition rate 1/T should be greater than the ionic plasma frequency, and the pulsewidth $\tau$ should be significantly less than the time period T of the signal.

Conversely, if the selectivity of etching silicon dioxide, as opposed to silicon, is to be favored, it would be required to decrease the duration of positive ionic charge bombardment in favor of an increase in electronic charge bombardment. To that end, the repetition rate should be less than the ionic plasma frequency, while the period should be substantially greater than the difference between the period and the pulsewidth.

It is thus clear that the apparatus according to the present invention is capable of controlling etching operations irrespective of the type of substrate and the etching parameters to be achieved.

The cases for silicon and silicon dioxide were given merely as an example, but the optimization of etching speed of any substrate and the etching selectivity with two superimposed layers can be controlled by acting on the three parameters of the signal applied to the electrode.

The above-described examples essentially concern etching operations, but it goes without saying that the process according to the invention can be applied to plasma treatments in the general sense of the term, and in particular to deposition processes.

What is claimed is:

1. A process for surface treatment of a substrate supported by an electrode, comprising the steps of:
    providing a chamber equipped with plasma generating means;
    placing said electrode-supported substrate in said chamber;
    maintaining within said chamber a continuous plasma that is substantially free of electromagnetic fields; and
    supplying an electrical signal to said electrode via a low-impedance capacitor, wherein said electrical signal comprises substantially rectangular voltage pulses having a period T and a pulse width $\tau$, a variable pulse repetition rate to control the energy distribution function of positive ionic charges bombarding the substrate, said variable pulse repetition rate being constant in time for a given treatment operation and being greater than the ionic plasma frequency, a variable ratio of $\tau/(T-\tau)$ for each pulse to control the timed distribution of negative electron charges and positive ionic charges bombarding the substrate, said ratio for each pulse being within the range of 1/20 and 20 inclusive, and a variable pulse amplitude to control the energy of positive ionic charges bombarding the substrate.

2. The process as claimed in claim 1, wherein the ratio $\tau/(T-\tau)$ is constant in time for a given treatment operation.

3. The process as claimed in claim 1, wherein said surface treatment signal is a periodic signal.

* * * * *